United States Patent
Seesink

[11] Patent Number: 5,949,288
[45] Date of Patent: Sep. 7, 1999

[54] CIRCUIT ARRANGEMENT WITH AN OPERATIONAL AMPLIFIER

[75] Inventor: Petrus H. Seesink, Best, Netherlands

[73] Assignees: Endress + Hauser GmbH + Co., Maulburg; ENVEC Mess- und Regeltechnik GmbH + Co., Weil am Rhein; Vega Grieshaber KG, Schiltach, all of Germany; Kavilco Corporation, Moorpark, Calif.

[21] Appl. No.: 08/899,536

[22] Filed: Jul. 24, 1997

Related U.S. Application Data

[60] Provisional application No. 60/022,965, Aug. 2, 1996.

[30] Foreign Application Priority Data

Jul. 25, 1996 [EP] European Pat. Off. ............ 96112035

[51] Int. Cl.⁶ .................................................. H03F 3/04
[52] U.S. Cl. ............................................ 330/293; 330/288
[58] Field of Search .................................. 330/293, 284, 330/144, 145, 288, 257, 311

[56] References Cited

U.S. PATENT DOCUMENTS

| | | | |
|---|---|---|---|
| 4,215,317 | 7/1980 | Traynor | 330/256 |
| 5,432,389 | 7/1995 | Bader et al. | 330/279 |

FOREIGN PATENT DOCUMENTS

| | | |
|---|---|---|
| 0 146 355 | 6/1985 | European Pat. Off. . |
| 2 674 706 | 10/1992 | France . |
| 405121959 | 5/1993 | Japan .................................. 330/293 |
| 2 053 598 | 2/1981 | United Kingdom . |

OTHER PUBLICATIONS

Tietze, U. and Schenk, Ch., *Halbleiter–Schaltungstechnik*, 1989, 9th Edition, pp. 132–137.

Tietze, U. and Schenk, Ch., *Electronic Circuits Design and Applications*, 1991, pp. 118–123.

*Primary Examiner*—Benny T. Lee
*Assistant Examiner*—Khanh Van Nguyen
*Attorney, Agent, or Firm*—Bose McKinney & Evans

[57] ABSTRACT

This circuit arrangement has the property of an amplifier with a set or adjustable non-inverting gain and contains an opamp (3) having an a non-inverting and an inverting input (31, 32) as well as an output (33) which is also a signal output (A) of the circuit arrangement, and a current copier (8) having a current input and a current output. The noninverting input (31) is connected to a first reference potenial ($P_1$) and the output (33) via a first resistor (1) to the inverting input (32). The input (E) of the circuit arangement is connected via a second resistor (2) to the current input of the current copier (8) the current output of which is connected to the inverting input (32). The output section of the current copier is connected to a second reference potential ($P_2$) and its input section to the first reference potential.

4 Claims, 2 Drawing Sheets

CIRCUIT ARRANGEMENT WITH AN
OPERATIONAL AMPLIFIER

This application claims benefit of Provisional Application Ser. No. 60/022,965, filed Aug. 2, 1996.

FIELD OF THE INVENTION

The invention relates to a circuit arrangement with an operational amplifier, which circuit arrangement has the property of an amplifier with a set or adjustable non-inverting gain.

BACKGROUND OF THE INVENTION

As is known, operational amplifiers are amplifiers based on the principle of the differential amplifier and realized as integrated, in particular monolithically integrated, semiconductor circuits. According to the reference book by U. Tietze and Ch. Schenk, "Electronic Circuits, Design and Applications", 1991, ISBN 0-387-50475-4, pages 118 to 123, either a circuit arrangement with the property of a non-inverting amplifier or a circuit arrangement with the property of an inverting amplifier can be realized with an operational amplifier, by virtue of the resistor circuitry of its two inputs and of the output.

In the case of the inverting amplifier, a first resistor having the value $r_1$ connects the output of the operational amplifier to the inverting input of the latter. Furthermore, a second resistor having the value $r_2$ is connected between the input of the circuit arrangement and the inverting input of the operational amplifier. The common junction point of the two resistors is therefore connected to the inverting input of the operational amplifier. Its non-inverting input is connected to the circuit zero-point.

The gain v of this inverting amplifier is as follows, the minus sign indicating the phase shift of 180° between the input and output signals:

$$v = -r_1/r_2 \quad (1)$$

In the case of the non-inverting amplifier, on the other hand, a first resistor having the value $r_1'$ is connected to the output of the operational amplifier. A second resistor having the value $r_2'$, which leads to the circuit zero-point, is connected in series with said first resistor. The common junction point of the two resistors is connected to the inverting input of the operational amplifier, and its input is identical to that of the non-inverting amplifier. The gain v' of this amplifier is as follows;

$$v' = 1 + r_1'/r_2', \quad (2)$$

in other words is positive, which indicates phase coincidence between the input and output signals.

Compared with the inverting amplifier explained above, the non-inverting amplifier has the disadvantage that its gain can only be equal to or greater than one.

If the two resistors are also incorporated in an integrated semiconductor circuit as mentioned above, then it in, moreover, difficult to obtain gain values of between 1 and 1.25, since unfavorable resistor values are necessary for this.

In the case of these small gains, moreover, a further disadvantage of the non-inverting amplifier arises, which is based on the property of the latter that the respective potential of the two inputs is equal to the input voltage of the amplifier. Consequently, each input must be able to follow the input voltage, the maximum value of which may be considerable. The input voltage range which, on the other hand, can still just be processed by the amplifier is referred to as its common mode input range.

In the case of said small gains, it is then possible to realize necessary, largo values of the common mode input range only with difficulty, if at all. Since, furthermore, today's integrated semiconductor circuits frequently comprise digital subcircuits, which process digital signals and have a digital circuit zero-point corresponding to a first reference potential, and analog subcircuits, which process analog signals and have an analog circuit zero-point corresponding to a second reference potential, in the case of the non-inverting amplifier the current in the second resistor flows to the potential of the analog circuit zero-point.

Only when the latter has a sufficiently low series resistance with respect to the main circuit zero-point of the integrated semiconductor circuit does the current also flowing therein not cause an interference voltage superposed on the desired potential of the analog circuit zero-point. However, the necessary, low series resistance can often not be realized owing to other conditions of the integrated semiconductor circuit which have to be complied with.

SUMMARY OF THE INVENTION

The invention therefore serves for the joint solution of these four different problem areas and, therefore, consists in a circuit arrangement with an input, with an output, with a first operational amplifier and with a current copier which has a current input and a current output, which circuit arrangement has the property of an amplifier with a set or adjustable non-inverting gain, the first operational amplifier having an inverting and a non-inverting input as well as an output which is also a signal output or the circuit arrangement, the non-inverting input being connected to a first reference potential, the output being connected via a first resistor to the inverting input, the input of the circuit arrangement being connected via a second resistor to the current input of the current copier, and the current output of the current copier being connected to the inverting input of the first operational amplifier, the output section of the current copier being connected to a second reference potential, and the input section of the current copier being connected to the first reference potential.

According to a first preferred embodiment of the invention, the second resistor consists of a first and a second partial resistor, which are connected in series with one another, and a first switch, which is arranged between the current input of the current copier and the first partial resistor, and a second switch are present, which is arranged between the current input and a junction point of the partial resistors.

According to a second preferred embodiment of the invention, the input section of the current copier contains a second operational amplifier having an inverting and having a non-inverting input as well as having an output, the output being the current input of the current copier and also being connected to the inverting input, and the non-inverting input being connected to the first reference potential.

According to a second preferred embodiment of the invention, the input section of the current copier contains, finally, a second operational amplifier having an inverting and having a non-inverting input as well as having an output, the output being the current input of the current copier, the non-inverting input being connected to the first reference potential, a first series circuit formed by a third and a fourth switch as well no a second series circuit formed by a fifth and a sixth switch being connected between the input of the current copier and the inverting input, the first partial resistor being connected between the junction point of the third and of the fourth switch and the junction point of the fifth and of the sixth switch, the second partial resistor leading to the junction point of the fifth and of the sixth switch, and either the third and the fourth switch being simultaneously closed or the fifth and the sixth switch being simultaneously closed, and the current output of the current copier being connected to the inverting input of the first operational amplifier via a permanently closed switch.

One advantage of the invention consists in the fact that, if the respective value of the first and of the second resistor is designated by $R_1$ and $R_2$ respectively, the gain V of the non-inverting amplifier of the invention is equal to $R_1/R_2$:

$$V = +R_1/R_2 \quad (3)$$

As A result, however, the restriction, which results from the one in equation (2), of the gain to values equal to or greater than one is dispensed with, and gain values of between zero and one can also be realized.

A further advantage is that it is now readily possible to realize gains of between 1 and 1.25. In addition, there is no resistor connected to a circuit zero-point, with the result that there is no current flowing through it either, and thus the potential of the analog circuit zero-point remains uninfluenced by it.

BRIEF DESCRIPTION OF THE DRAWINGS

The invention and further advantages will now be explained in more detail using exemplary embodiments, which are illustrated in the figures of the drawing.

DETAILED DESCRIPTION OF THE DRAWINGS

Figure 1:
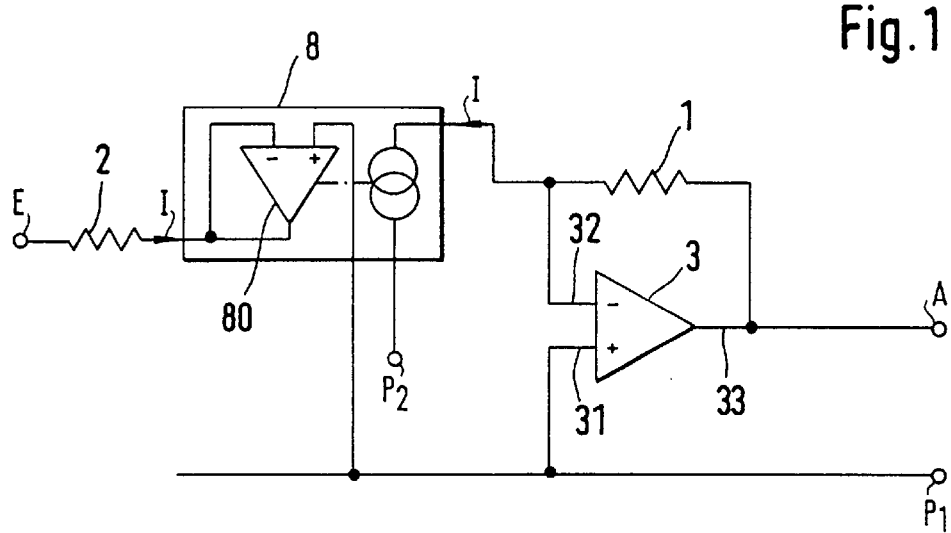
FIG. 1 shows, in block-diagram form, the principle underlying the invention.

In order to explain the principle underlying the invention, the block diagram of FIG. 1 shows the circuit arrangement of an amplifier with a set or adjustable non-inverting gain V. The circuit arrangement has an input E and an output A, with the result that a signal present at the input E, referring to a first reference potential $P_1$, appears at the output A, after having been amplified by the set gain V.

Essential parts of the amplifier are a first operational amplifier 3, a current copier 8 having a current input and a current output, a first resistor 1 having the resistance $R_1$ and a second resistor 2 having the resistance $R_2$. The current copier a is drawn by two overlapping circles which are the commonly usual symbol of a current source.

The operational amplifier 3 has a non-inverting input 31, which is provided with a plus symbol in the figures, as is generally conventional in block diagrams of operational amplifiers, and an inverting input 32, which is provided with a minus symbol in the figures. The output 33 of the operational amplifier 3 is simultaneously the output A of the circuit arrangement. The non-inverting input 31 is connected to the first reference potential $P_1$.

The output 33 is connected via the first resistor 1 to the inverting input 32, which is connected to the current output of the current copier 8. The current input of said current copier is connected to the input E of the circuit arrangement via the second resistor 2.

Figure 2:
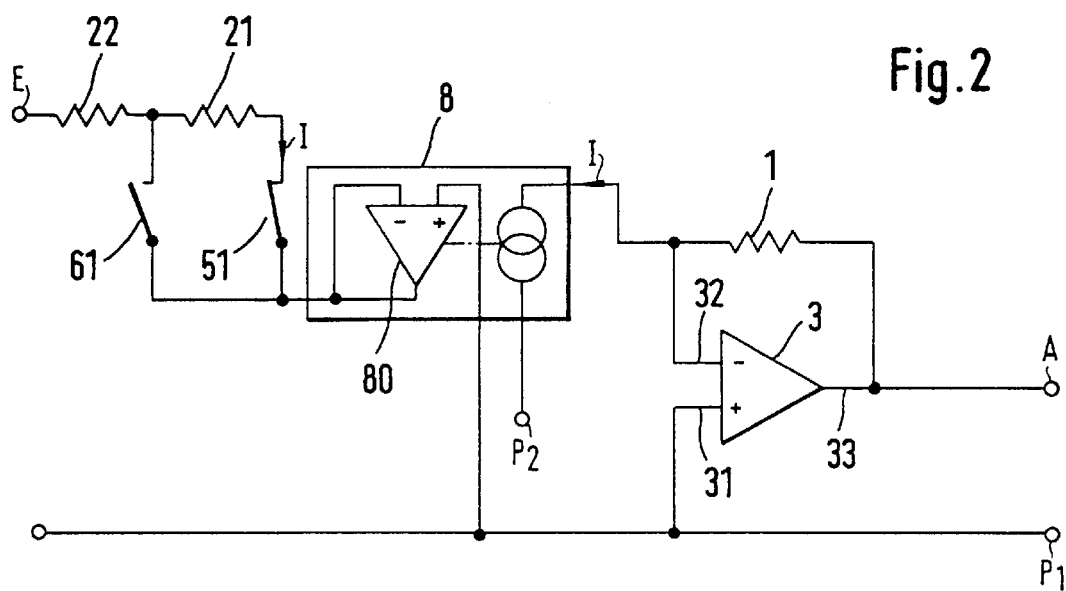
FIG. 2 shows, in block-diagram form, one preferred embodiment of invention.

An input section of the current copier 8, which is a second operational amplifier 80 in the embodiments of FIGS. 1 and 2, is connected to the first reference potential $P_1$. To be precise, in the case of the operational amplifier 80, this is the non-inverting input thereof. Its inverting input and its output are connected to one another and are the current input of the current mirror 8. The output section of the current copier 8 is connected to a second reference potential $P_2$.

A current flowing through the second resistor 2 and into the input circuit of the current copier 8 and having a current value I appears in the output circuit of said current copier, in accordance with the essential property of current copiers, with the same current value I and likewise flows into the output circuit of said current copier, in other words the current is "copied".

Since the input resistance is ideally equal to infinity in the case of operational amplifiers, but in reality lies in the megohm range, the copied current having the current value I flows solely through the first resistor 1. Consequently, the above equation (3) holds true.

In the case of the embodiment of the invention shown in FIG. 2, the second resistor 2 according to FIG. 1 is replaced by a first and a second partial resistor 21, 22 having the respective resistances $R_{21}$ and $R_{22}$, which partial resistors are connected in series. A first switch 51 is arranged between the current input of the current copier 80 and the first partial resistor 21 and a second switch 61 is ar-ranged between this current input and a junction point between the partial resistors 21, 22.

Consequently, it is possible to set two different values of the gain V by correspondingly closing the respective switch 51, 61:

When switch 61 is—as depicted—open and switch 51 is—as depicted—closed, the sum $R_{21}+R_{22}$ of the resistances $R_{21}$, $R_{22}$ is effective, and when switch 51 is open and switch 61 is closed, or when both switches 51, 61 are closed, only the resistance $R_{22}$ is effective.

Figure 3:
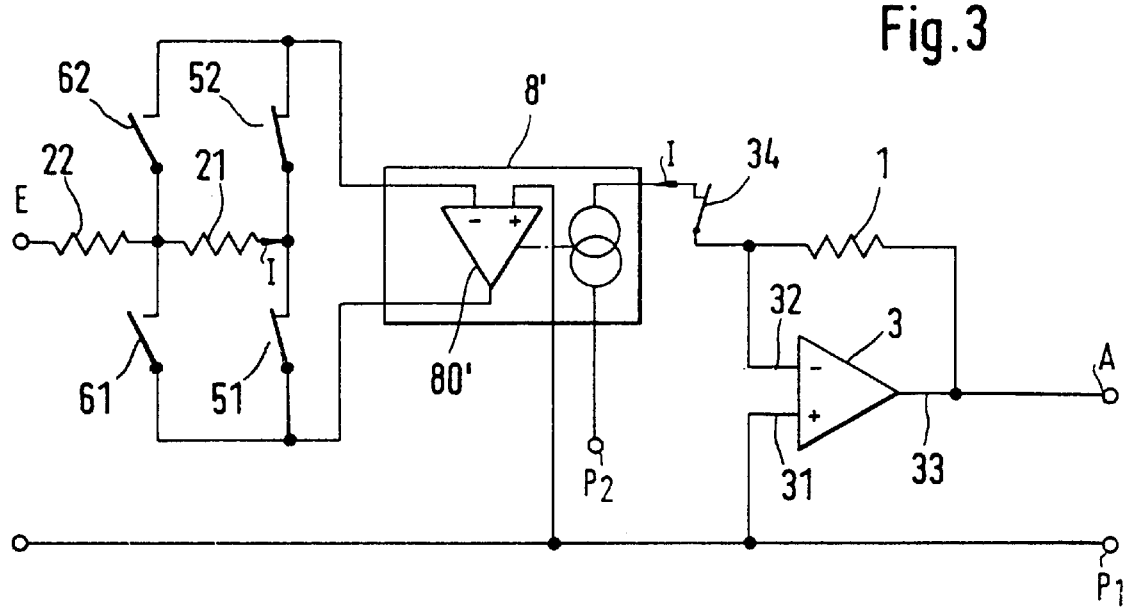
FIG. 3 shows, in block-diagram form, another preferred embodiment of invention.

FIG. 3 shows another embodiment of the invention which is more favorable than the embodiment according to FIG. 2 when not only the current copier but also the switches 51, 61 are intended to be part of an integrated semiconductor circuit. The switches 51, 61 are then electronic switches in the form of transistors, and their respective internal resistance in the on state, the so-called ON resistance, is voltage-dependent and, in addition, is not negligible. Specifically, in the case of the circuit arrangement according to FIG. 2, the ON resistance is added to the resistances $R_{21}$, $R_{22}$, since ten current having the value I flows via the switches 51, 61.

The circuit arrangement of FIG. 3 does not have this disadvantage. For this purpose, in the current copier 8', first of all the connection between the inverting input of the second operational amplifier 80' and the output of the latter, such a connection being present in FIG. 2, in eliminated and the inverting input itself is connected up.

To this end, a further switch 52 is arranged between the junction point of the switch 51 with the partial resistor 21 and the inverting input of the operational amplifier 80'. In a comparable manner, a further switch 62 is connected between this inverting input and the junction point between the partial resistors 21, 22. The switches 51 and 52, and 61 and 62, thus respectively form a first and a second series circuit of switches. In each of these series circuits, the switches must be simultaneously closed or open.

It is again possible to set two different values of the gain V by correspondingly closing the respective switches 51, 52 and/or 61, 62:

When the switches 61, 62 are—as depicted—open and the switches 51, 52 are—as depicted—closed, the sum $R_{21}+R_{22}$ of the resistances $R_{21}$, $R_{22}$ is effective, and when the switches 51, 52 are open and the switches 61, 62 are closed, or when all four switches are closed, only the resistance $R_{22}$ is effective.

Although, the circuit arrangement of FIG. 3, too, in the state depicted, has a voltage drop across the ON resistance of the switch 51 generated by the current flowing through the latter and having the value I, this voltage drop cannot adversely affect the voltage occurring at the junction point of the switch 51 with the partial resistor 21, since obviously this junction point is virtually connected to the first reference potential $P_1$ via the switch 52. The same is comparably true when the switches 61, 62 are closed. This applies as long as the abovementioned voltage drop does not limit the output voltage of the operational amplifier 80' or drive it to saturation.

In order to ensure that the respective voltages at the current input and at the current output of the current copier 8' are identical, provision is made of a permanently closed switch 34, which connects the inverting input 32 of the first operational amplifier 3 to the current output of the current copier 8' and, naturally, is likewise realized, like the other switches, by a semiconductor component. The switch 34 can also been inserted into the circuits of FIGS. 1 and 2, if necessary.

In the case of insulated-gate field-effect transistors as switches, the respective width-to-length ratio of the gate electrodes of the field-effect transistors which realize the switches 34, 61, 62, that is to say the so-called W/L ratio, must be made identical.

If the partial resistor 21 has a sufficiently low value, the further switches 52, 62 can be omitted and the inverting input of the operational amplifier 80' can be connected to the junction point of the partial resistor 21 with the switch 51.

If it is intended to be able to set more than two gain values, then the series circuit formed by the partial resistors 21, 22 according to the example of FIGS. 2 and 3 can, of course, have further partial resistors added to it, to which partial resistors corresponding further switches must then be assigned.

Figure 4:
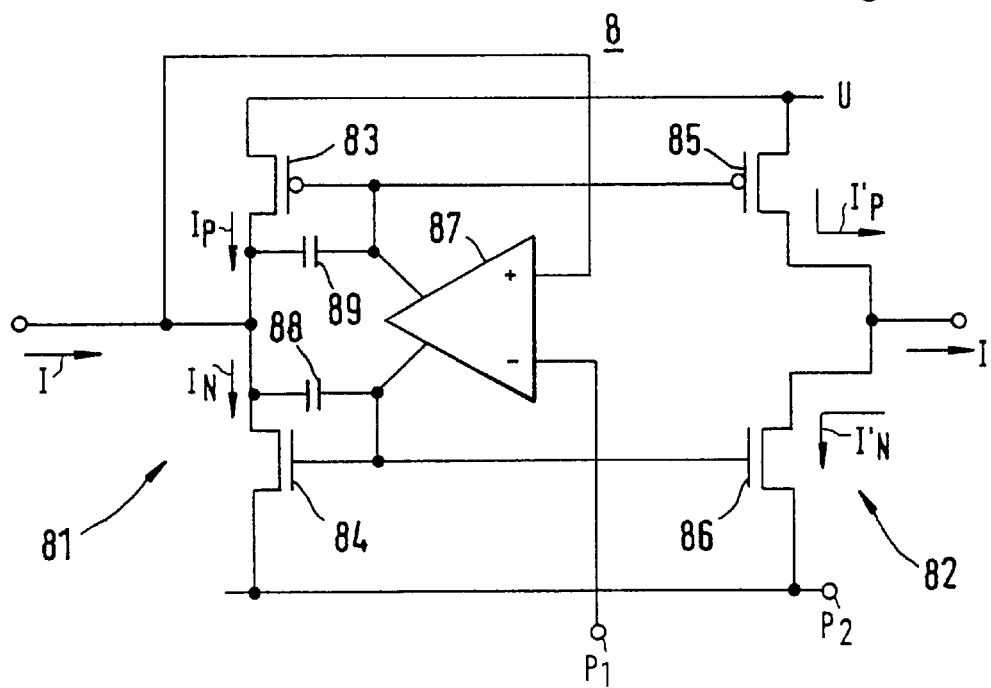
FIG. 4 shows the circuit diagram of a current copier realized using CMOS technology.

FIG. 4 shows the circuit diagram of a current copier 8 which is realized using the technology of integrated complementary enhancement-mode insulated-gate field-effect transistors, that is to say using so-called CMOS technology.

In detail, the circuit diagram of FIG. 4 shows a first series circuit 81 formed by two transistors 83, 84 which are connected between an operating potential U and the second reference potential $P_2$, have their controlled current paths connected in series and are of mutually complementary conductivity types.

Furthermore, there is a second series circuit 82 formed by two transistors 85, 86 which are connected between the operating potential U and the second reference potential $P_2$, have their controlled current paths connected in series and are of mutually complementary conductivity types; transistors 83 and 85 are p-channel transistors and transistors 84 and 86 are n-channel transistors. The control terminals of the two transistors 83, 85 are connected to one another, as are the control terminals of the two transistors 84, 86.

The junction point between the controlled current paths of the transistors 83, 84 of the first series circuit 81 is connected to the non-inverting input of a further operational amplifier 87, the inverting input of which is connected to the first reference potential $P_1$.

The operational amplifier 87 has a differential output, one pole of which is connected to the junction point between the control terminals of the two transistors 84, 86 and the other pole of which is connected to the junction point between the control terminals of the two transistors 83, 85.

Furthermore, each of these poles is connected via a respective capacitor 88 and 89 to the junction point between the controlled current paths of the transistors of the first series circuit 81. Depending on the specific internal circuitry of the further operational amplifier 87, it is also possible just to provide either the capacitor 88 or just the capacitor 89.

FIG. 4 also illustrates the behavior of the current copier 8 with regard to the current having the value I. This current is divided into a "positive" current $I_P$ flowing in the transistor 83 and a "negative" current $I_N$ flowing in the transistor 84. Correspondingly, identical—copied—currents $I'_P$ and $I'_N$, respectively, flow into the transistors 85, 86 of the second series circuit 82 and add up to the—copied—current having the value I.

Finally, the following is also pointed out: Usually, integrated semiconductor circuits which exclusively process digital signals are fed by an operating voltage source whose negative pole serves as circuit zero-point and can thus also be referred to an digital circuit zero-point. In the manufacturer's data, the potential of this digital circuit zero-point is often abbreviated to $V_{ss}$ and the positive potential is often designated by $V_{dd}$ or $V_{cc}$. Moreover, an operating voltage source which also has a negative voltage with respect to the digital circuit zero-point is not necessary. A nowadays widespread and customary value $V_{dd}$ or $V_{cc}$ of the operating voltage is +5 V.

Since analog signals can assume both positive and negative values with respect to a reference potential, which can be regarded an analog circuit zero-point, integrated semiconductor circuits which process analog signals require an operating voltage source which has both a positive and a negative value with respect to this analog circuit zero-point, in other words a bipolar operating voltage source. If the reference potential is then selected to be 0 V, that is literally the analog circuit "zero-point". However, $V_{ss}$ must then have the value −2.5 V, for example, and $V_{dd}$ or $V_{cc}$ the value +2.5 V.

For integrated semiconductor circuits which process both analog and digital signals, referred to as mixed circuits below, this means, for example, that the digital circuit zero-point has a potential $V_{ss}$ of −2.5 V, while the analog circuit zero-point has 0 V. However, this necessitates the above bipolar operating voltage source. In order to avoid this, it is frequently the case in mixed circuits that the analog circuit zero-point is put at +2.5 V and the digital circuit "zero-point" is put at 0 V.

Since this selection and the voltage values cited are not mandatory, the above discussion generalized by talking of a first and of a second reference potential $P_1$, $P_2$. For the above voltage values and their polarities, the first and the second reference potential $P_1$, $P_2$ respectively correspond in any case to said analog circuit zero-point and the digital circuit zero-point explained.

I claim:

1. A circuit arrangement with an input, with an output, with a first operational amplifier and with a current copier which has a current input and a current output, which circuit arrangement has the property of an amplifier with a set or adjustable non-inverting gain, the first operational amplifier having an inverting and a non-inverting input as well as an output which is also a signal output of the circuit arrangement, the non-inverting input being connected to a first reference potential, the output being connected via a first resistor to the inverting input, the input of the circuit arrangement being connected via a second resistor to the current input of the current copier, and the current output of the current copier being connected to the inverting input of the first operational amplifier, the output section of the current copier being connected to a second reference potential, and the input section of the current copier being connected to the first reference potential, wherein the current flowing into the output section of the current copier equals the current flowing into the input section of the current copier and the non-inverting gain of the circuit arrangement equals the value of the first resistor divided by the value of the second resistor.

2. A circuit arrangement with an input, with an output, with a first operational amplifier and with a current copier which has a current input and a current output, which circuit arrangement has the property of an amplifier with a set or adjustable non-inverting gain, the first operational amplifier having an inverting and a non-inverting input as well as an output which is also a signal output of the circuit arrangement, the non-inverting input being connected to a first reference potential, the output being connected via a first resistor to the inverting input, the input of the circuit arrangement being connected via a second resistor to the current input of the current copier, the second resistor includes a first and a second partial resistor, which are connected in series with one another, a first switch, which is arranged between the current input of the current copier and the first partial resistor, and a second switch, which is arranged between the current input and a junction point of the partial resistors, the current output of the current copier being connected to the inverting input of the first operational amplifier, the output section of the current copier being connected to a second reference potential, and the input section of the current copier being connected to the first reference potential.

3. A circuit arrangement as claimed in claim 1 wherein the input section of the current copier contains a second operational amplifier having an inverting and having a non-inverting input as well as having an output, the output being the current input of the current copier and also being connected to the inverting input, and the non-inverting input being connected to the first reference potential.

4. A circuit arrangement as claimed in claim 2 wherein the input section of the current copier contains a second operational amplifier having an inverting and having a non-inverting input as well as having an output, the output being the current input of the current copier, the non-inverting input being connected to the first reference potential, a first series circuit formed by a third and a fourth switch as well as a second series circuit formed by a fifth and a sixth switch being connected between the input of the current copier and the inverting input, the first partial resistor being connected between the junction point of the third and of the fourth switch and the junction point of the fifth and of the sixth switch, the second partial resistor leading to the junction point of the fifth and of the sixth switch, and either the third and the fourth switch being simultaneously closed or the fifth and the sixth switch being simultaneously closed, and the current output of the current copier being connected to the inverting input of the first operational amplifier via a permanently closed switch.

* * * * *